US008735866B2

(12) United States Patent
Bochkov

(10) Patent No.: US 8,735,866 B2
(45) Date of Patent: May 27, 2014

(54) HIGH-VOLTAGE ELECTRONIC DEVICE

(76) Inventor: Viktor D. Bochkov, Ryazan (RU)

( * ) Notice: Subject to any disclaimer, the term of this patent is extended or adjusted under 35 U.S.C. 154(b) by 0 days.

(21) Appl. No.: 13/575,149

(22) PCT Filed: Jan. 26, 2011

(86) PCT No.: PCT/RU2011/000038

§ 371 (c)(1), (2), (4) Date: Jul. 25, 2012

(87) PCT Pub. No.: WO2011/093746

PCT Pub. Date: Aug. 4, 2011

(65) Prior Publication Data

US 2012/0292591 A1 Nov. 22, 2012

(30) Foreign Application Priority Data

Jan. 28, 2010 (RU) ................................ 2010102657

(51) Int. Cl.
*H01L 29/06* (2006.01)
*H01L 29/12* (2006.01)

(52) U.S. Cl.
USPC .................................... 257/10; 257/E29.068

(58) Field of Classification Search
USPC ............................................ 257/10, E29.068
See application file for complete search history.

(56) References Cited

FOREIGN PATENT DOCUMENTS

| | | | |
|---|---|---|---|
| RU | 28283 | * 10/2003 | H01J 5/08 |
| SU | 19800915 | * 9/1980 | H01J 5/08 |

* cited by examiner

*Primary Examiner* — David S Blum
(74) *Attorney, Agent, or Firm* — Donn K. Harms

(57) ABSTRACT

A high-voltage electronic device comprising high-voltage electrodes, located in a dielectric envelope with an internal surface coated with a material having a conductivity which is greater than the conductivity of the envelope, characterized in that the areas subject to high field strength are coated with composite material, based on a polycrystalline material with a bulk conductivity of particles $10^{-9}$ to $10^{-13}$ $Ohm^{-1}$ $cm^{-1}$, each of which contains a surface nanolayer of bonding inorganic material. The high-voltage electrodes may be placed in a vacuum envelope and fixed on coated insulators. Preferred coating materials include materials from a group of materials comprising; oxides of chromium, boron or zirconium in the form of polycrystalline porous substance with a particle size of 30 nm-30 microns, connected to each other with an inorganic material, for instance silicon oxide ($SiO_2$) with a layer thickness not more than 100 nm.

1 Claim, 2 Drawing Sheets

HIGH-VOLTAGE ELECTRONIC DEVICE

Figure 1:
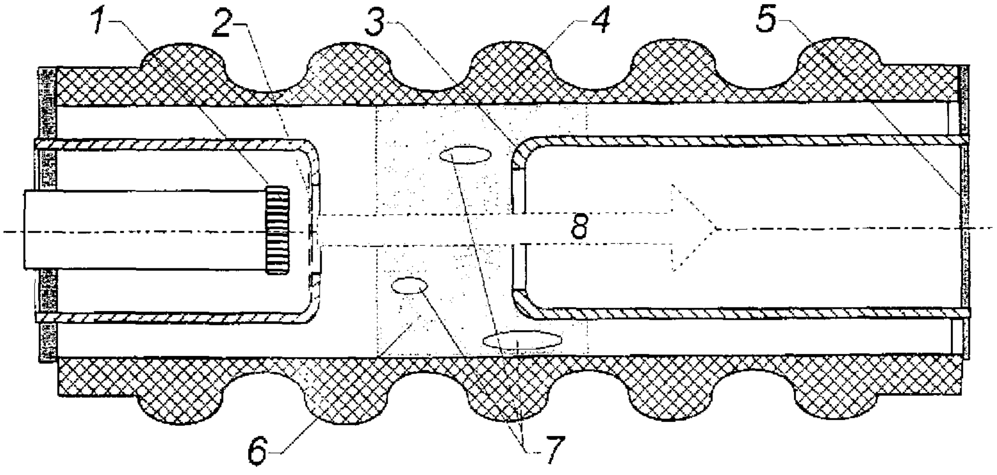

This application claims priority to Russian patent application number 2010102657 filed on Jan. 28, 2010 and International application number PCT/RU2011/000038 filed on Jan. 26, 2011.

(i) TECHNICAL FIELD

The invention relates to a high-voltage vacuum electronics, in particular to the X-ray and neutron tubes, gas discharge devices, elements of particle accelerators and other devices used in industry, science, defense and medicine. This invention relates to design and method of manufacture of vacuum devices and electronic devices with high hold-off voltage capability and can be used in their manufacture.

(ii) PRIOR ART

High-voltage electronic gas-discharge and vacuum tubes (GD and EV), including X-ray (XR) and neutron tubes, gyrotrons, thyratrons and spark gaps are widely used in various equipment in industry, medicine, science, defense technology. The production of these devices relates to high technology and is concentrated in companies of industrially developed countries: USA (GE, Litton, Varian), Germany (Siemens, Lohmann), Netherlands (Philips), Japan (Toshiba), Russia (Svetlana), etc.

The processes of technology development providing scientific and technological progress, competition with solid-state devices require substantial upgrading or creating brand new GD and EV devices. The most principle object is to reduce dimensions and mass, simultaneously providing high reliability and durability at voltages of up to hundreds of thousands of volts, narrow focal spot, high efficiency and environmental safety. To cope with the problems it is essential to consider the whole complex of challenges with which the most of designers and manufacturers of equipment are facing, even a development of specialized units on the basis of new types of GD and EV devices. X-ray tubes are typical of high-voltage GD and EV devices.

The most complete investigation devoted to the vacuum breakdown, manufacturing technology to improve a hold-off voltage capability of vacuum devices is described in the book by I. N. Slivkov, "Electrical Insulation and Discharge in Vacuum", Atomizdat, Moscow, 1972. However, the majority of the known methods of electrodes treatment are out-of-date and do not take into account such important factors as influence of dielectric envelope on initiation of break-down.

Currently, the majority of tubes intended for diagnosis, treatment and inspection are made with extended middle section of envelope. The advantages of this design are described in [V. I. Rakov, "Electronic X-ray tubes", GEI, Moscow-Leningrad, 1952]. On page 56 it is read: "Cylinders with extended middle section and narrow necks are most beneficial in terms of high dielectric strength. Extended middle part of the balloon reduces electric field inside the tube. Owing to extended surface, glass is less heated by thermal radiation from the cathode and the anode and bombardment by secondary electrons. A charge accumulated on a glass as well as potential gradient in the glass envelope is reduced."

However, this design has a disadvantage inherent in most of the mentioned structures, namely, enormous size. This drawback is particularly important for oil-insulated tubes where the increase in dimensions leads to significant increase of its mass. The optimal, most advantageous design comprises a cylindrical shape of the tube. However, application of the design is hampered by a sharp decrease of hold-off voltage with a significant increase of envelope breakdown probability.

One of the first patents, considering envelope effects on reliability of the devices, was a [U.S. Pat. No. 1,954,709, Class 313-58, published 1934]. The patent claimed to eliminate breakdowns in the envelope by introducing protective metal cylinders on either sides of envelope in a high voltage gap region. The cylinders were externally connected, and in addition, surrounded by another envelope on the outside. A cavity between the outer cylinder and the outer envelope was evacuated. This was done to increase a dielectric strength outside the envelope, as in operation the metal cylinders acquire a significant electrical charge, which leads to appearance of break-downs over the outer side of the tube.

The obvious drawback of this method of protection is the design complexity, a significant increase in size and weight of the device. The design is applicable at low accelerating voltages (up to 50 kV) only.

In [U.S. Pat. No. 2,516,663, Class 313-58, published 1950] it is proposed for protection of a multi-section glass tube from appearing surface charge to apply a conductive coating (method of irisation) based on indium, with the surface resistance of 25-500 Ohms per square (bulk conductivity from $10^{-2}$ to $10^{-3}$ $Ohm^{-1}$ $cm^{-1}$). In order to obtain a uniform distribution of potential over the sections and to efficiently remove charge from the glass, the coating is electrically connected to anode and sections. The patent discloses that the coating is provided on sections of the envelope near the anode, but it is possible to provide it over the entire surface of sections.

The patented method of coating over the whole envelope surface does not seem ideal, as calculations show that even at voltages of tens of kilovolts on such a coating an enormous power will be allocated upon energization of the electrical circuit. If the coating is provided on the part of the envelope adjacent to the anode in single-section tubes only, the effective length of the insulating envelope in vacuum decreases, resulting in increased parasitic leakage currents, which deteriorates vacuum quality and destroys the tube. Therefore, this method of protection, at least in the single-section tubes is not applicable.

(iii) DISCLOSURE OF THE INVENTION

The technical problem to be solved by the invention is to create a design of electronic device, which combines low weight and dimensions with high reliability, and in particular high hold-off voltage capability. The physical basis, providing a possibility of the decision, is to consider an interaction of processes on surface of a high-voltage electrode system, on surface and in volume of dielectric envelope, and processes outside the envelope.

The key elements mostly influencing hold-off voltage capability of high-voltage devices with a substantial distance between the electrodes (more than 5 mm) are a dielectric envelope and insulators placed inside the tube. The dielectric envelope in operation of high-voltage vacuum tubes is exposed to a complex of factors: high electric fields, X-ray radiation, bombardment by high-energy ions and electrons. The sources of electrons are centers of electron field emission on the surface of the electrodes, whereas ions intensively originate during breakdown of vacuum insulation, surface and volume of the dielectric. Under the conditions, a polarization, similar to that in radio- and electroelectrets, occurs on the surface and in the bulk of dielectric envelope.

During operation with discharges in the interelectrode gap, the envelope in the regions adjacent to anode and cathode, acquires potential approaching that of corresponding electrodes. [Bochkov V. D. and Pogorel'skii M. M., "Study of the charge distribution over insulating envelope in a high-voltage vacuum device", Instruments and Experimental Techniques, Vol. 41, No. 2, 1998, pp. 216-221]. Meanwhile if the charge in the cathode region does not evidently change (homocharge is formed), in anode region the homocharge is established only after occurrence of discharges or breakdowns in the vacuum interelectrode gap. The said surface charge concentration reaches $5\times10^{-6}$ C/cm$^2$, and the potential of the envelope in the anode region approaches the potential of anode. The positive charge dominates in this region.

The appearance of this charge causes a dramatic deterioration of operating conditions for the envelope in this region: it enhances intensity and energy of impinging electrons, which facilitates accumulation of significant electron bulk charge at the depth corresponding to a particle path (up to 60 μm at 150 keV). When the accumulated bulk charge reaches the value of $10^{-8}\div10^{-6}$ C field strength exceeds dielectric strength of glass, which results in breakdowns of near-surface layers with the breakdown channel going to the inner surface of the envelope and occurrence of plasma in the high-voltage gap.

In addition to reduction of dielectric strength, these processes can lead to catastrophic de-struction of the dielectric itself—through-breakdown, resulting in loss of vacuum tightness and failure of the device. Destruction of dielectric occurs due to simultaneous action of two basic factors: sufficient density of positive surface charge on the dielectric and local bombardment of the dielectric by electrons with energy more than 50÷110 kV. Under the said conditions the breakdown develops in two stages. The first is accumulation of negative space at a mean free path from the internal surface and appearance of near-surface breakdowns in the field of this charge. In the second stage the breakdown occurs through the whole bulk of dielectric due to significant increase of electric field both of electrodes and surface charge by breakdown conducting channel.

Another factor that greatly affects the hold-off voltage capability of devices is intensity of field emission from electrodes. Suppression of emissions can simultaneously prevent accumulation of high densities of charge in the dielectric volume, reduce a risk of near-surface and cross-dielectric breakdown, and reduce the origin of ions inside the device. By reduction of a number of surface irregularities (microprotrusions, alien films and foreign inclusions) it is possible to reduce intensity of electron emission from electrodes.

In production a high precision of electrode surface treatment is achieved mainly by trivial methods, e.g. mechanical (polishing), and electroplating. However, even the most careful polishing without modification of its crystal structure cannot provide for a high dielectric strength. In particular, within a lifetime upon influence of electric fields and metal vapors, monocrystals can emerge from a crystal structure of electrodes in the direction of electric field, leading to increased field-emission current. In this regard, in order to increase the reliability one must take into account a microstructure of surface and accordingly a modification of the surface on a nanoscale, hampering the appearance of crystals on it.

The third factor affecting the reliability is a condition of the environment in which the tube is operated, in particular dielectric strength of oil.

The stated technical problem is solved by a set of measures.

First, the problem is solved by the fact that the electronic device comprising high-voltage electrodes—a positive (anode) and negative (cathode or grid) are accommodated in a dielectric envelope coated on its inner surface, wherein the conductivity of the coating is greater than the conductivity of the envelope. In the areas with high field strength the coating is made of composite material, based on polycrystalline material with bulk conductivity of the particles from $10^{-9}$ to $10^{-13}$ Ohm$^{-1}$ cm$^{-1}$, with every particle containing on its surface a nanolayer of bonding inorganic material such as silicon oxide ($SiO_2$).

Another difference is that the high voltage electrodes are located in a vacuum envelope and fixed on insulators, and both envelope and the internal surface of the insulators are coated with the coating described in p. 1.

The third difference is that the surface of the dielectric envelope located in a vacuum is coated with a material consisting of oxides of chromium, boron or zirconium in the form of polycrystalline porous substance with a particle size of 30 nm-30 microns, connected to each other with an inorganic material, for instance silicon oxide ($SiO_2$) with a layer thickness not more than 100 nm.

The fourth difference is that in the high-voltage electron device the thickness of coating is not less than 0.2 of the mean free path of electrons in the coating material at maximum anode voltage of the device.

The fifth difference is that the coefficient of secondary electron emission of the basic coating material is not more than 1.5.

The sixth difference is that the high-voltage electrodes have a modified surface, featuring ultra-fine-grained or amorphous structure with a depth up to 30 um, made by the means of treatment with a high-current pulsed electron or ion beam. The seventh difference is that the device is placed in a sealed-off container filled with a me-dium with a hold-off voltage greater than that for air at atmospheric pressure, for instance sulfur hexafluoride ($SF_6$), or transformer oil, cleaned and evacuated in a vacuum. Moreover, this medi-um has a pressure above atmospheric.

The use of high-resistance semiconductor (virtually insulating) envelope and insulator coatings in electronic devices as well as the modification of surface layer of high-voltage electrodes, allows making an electronic device with reduced size and weight due to a sharp reduction of leakage currents. Thus the probability of breakdown of the dielectric envelope is dramatically reduced, meanwhile a dielectric strength of the whole tube is improved. The coating affects a bulk conductivity of the insulators only. At the same time, the value of surface conductivity of insulators, unlike prototype, does not lead to a significant increase in leakage current between the electrodes. Practically, it is equal to the conductivity of uncoated envelope or insulator.

(iv) The Preferred Embodiments of the Invention

The known dielectric envelopes at operating temperature (−60 ÷+60° C.) feature very low electrical conductivity (less than $10^{-14}$ Ohm$^{-1}$ cm$^{-1}$). The most effective way of improving a dielectric strength and reliability of the electronic device is the use of dielectric coatings with a specific bulk electrical conductivity greater than that of the envelope, provided on inner surface of envelope in areas with high field strength. The said coating is made of composite material, based on polycrystalline material with a bulk conductivity of the particles ranging from $10^{-9}$ to $10^{-13}$ Ohm$^{-1}$ cm$^{-1}$, and every particle contains on its surface a layer of bonding inorganic material such as silicon oxide ($SiO_2$).

When the intensity of electron bombardment reaches tens of microamperes per $cm^2$ a minimum value of bulk conductivity of the particles should stay between $10^{-13}$ $Ohm^{-1}$ $cm^{-1}$ and the maximum—$10^{-9}$ $Ohm^{-1}$ $cm^{-1}$. The conductivity exceeding $10^{-13}$ $Ohm^{-1}$ $cm^{-1}$ leads to increased leakage currents, overheating of envelope, loss of power and development of surface breakdown.

Figure 2:
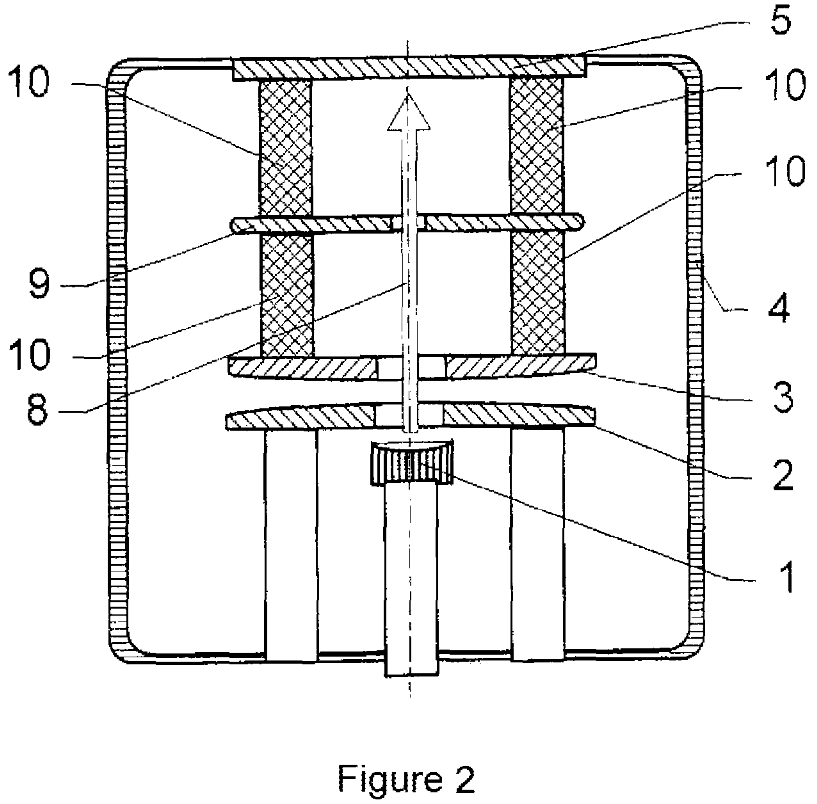
Figure 3:
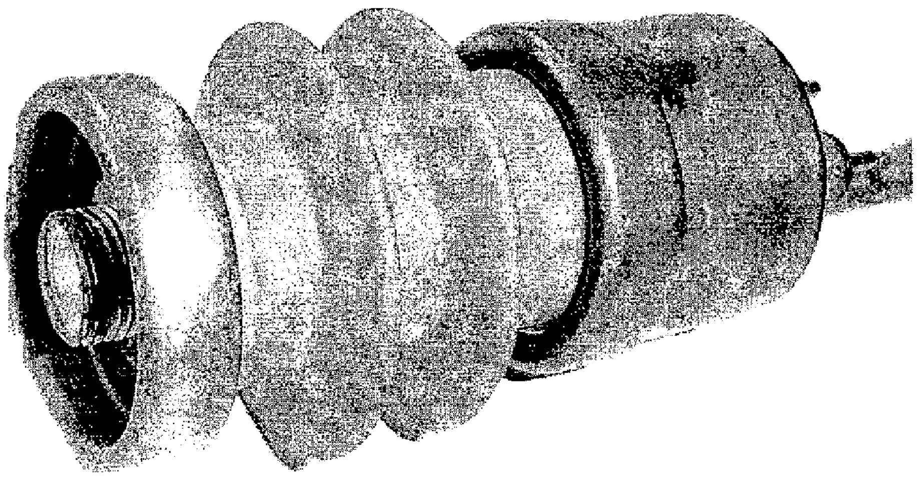

The embodiments of the present invention are illustrated by FIGS. 1, 2 and 3.

FIG. 1 is a general view of an electronic device comprising a cathode and high-voltage electrodes: control grid 2 and anode 3, ceramic or glass envelope 4 with developed external surface, a target 5. The inner surface of the dielectric envelope 4 is coated with composite material, based on a polycrystalline material with a bulk conductivity of the particles from $10^{11}$ $Ohm^{-1}$ $cm^{-1}$, each of which having a surface nanolayer of a bonding inorganic material. The porosity of the coating is 30 to 50% approximately. The device is placed in a sealed-off container filled with a medium with a hold-off voltage greater than that for air at atmosphere pressure, for instance sulfur hexafluoride ($SF_6$), or transformer oil, cleaned and evacuated in a vacuum. The medium is under increased pressure.

In FIG. 2 is a general view of electronic device, comprising a cathode and high-voltage electrodes: control grid 2 and anode 3, accelerating electrode 9, ceramic or glass envelope 4, the target (collector) 5. On the inner surface of the envelope 4 and insulators 10 (which may have a form of solid cylindrical pillars, with gaps between them), a dielectric coating of a composite material, based on a polycrystalline material with a bulk conductivity of the particles $10^{11}$ $Ohm^{-1}$ $cm^{-1}$, each of which having a surface nanolayer of a bonding inorganic material, is deposited.

In FIG. 3 a photograph of experimental electronic device for anode voltage up to 200 kV is shown. Overall dimensions of the tube: Ømax.=40 mm, H=90 mm.

The coating is provided in the places exposed to high electric fields and electron bombardment. In FIG. 1 the projections 7 of field-emission beams 4 of bombarding electrons are depicted. Emission centers of the beams are located on a lateral surface of a negative high-voltage electrode, which in this case is a grid 2. Field emission electrons from the end of the grid, as well as electrons 8 emitted from the cathode are focused on the target 5. For coating the substances with the coefficient of secondary electron emission from 1 to 1.5, for example, oxides of chromium, boron or zirconium in the form of a polycrystalline mass can be used. In order to ensure efficient operation of the tube, the thickness of the coating of dielectric (ideal dielectric for the envelope) must be equal to a mean free path of electrons impinging the envelope in the places subject to through breakdown.

However, there are factors that, in practice, allow reducing the thickness of the coating. In the surface layer of envelope there are a large number of defects, extending up to the depth of 5-20 μm depending on the type of dielectric material and technology of its production. The conductivity of such layers is increased compared to the bulk, which determines increased leakage of the charge and explains absence of through breakdown at electron energies less than 30-50 keV. When electron energy exceeds 50 keV, the surface layers defects allow using thinner layers of coatings down to 0.2 of the mean free path of electrons. Since the charge is localized in small areas, it is sufficient to dissipate it over the envelope in a thin layer adjacent to high-voltage electrodes. It is important that in this case there is no significant increase in leakage current between the electrodes.

The coating is made of a suspension containing metal oxides mixed with an alcohol solution of organosilicon esters. As a result, using a predefined basic material, e.g. crystals of $Cr_2O_3$ in the form of a powder with a particle size of 30 nm, after deposition on the envelope and drying in air at a temperature of 100° C., a coating in the form of solid conglomerate of bilayer particles is provided. The basis of such coating makes particles of $Cr_2O_3$, coated and bonded by $SiO_2$ layer with a thickness of several to tens of nanometers. The dielectric envelope may be composed of several elements, each of which has a cylindrical shape. The use of dielectric coatings can dramatically increase the dielectric strength of devices, to reduce size and weight, to a value almost unattainable by known design and engineering techniques.

High-voltage electrodes of the proposed device are made with a modification technology of the electrode surface from the crystal into an amorphous to a depth of 30 nm to 30 microns by means of ultra-fast (5-30 μs duration) heat treatment of low-energy high-current pulsed electron beam. Several processes simultaneously have a positive effect by changing the surface properties of the electrodes. Pulsed melting leads to a smoothing of the electrode surface and removes impurities and dissolved gases, which can significantly reduce the surface roughness up to higher degrees (mirror-like) and, thus, improve quality of processed products. After processing by a series of pulses the depth of treatment reaches tens of microns, the height of the microrelief—up to tens of nanometers.

The high rate of cooling of the treated layer (up to $10^7$-$10^{10}$ Kelvin degrees per second) enables ultra-fast hardening and strengthening the material surface, increasing resistance to corrosion, removing of impurities. As a result of the high-rate tempering from the melt, in the surface layer the structural and phase states are being formed that can provide improved properties of materials and products.

Surface modification of high-voltage electrodes allows providing fine crystalline or amorphous structure to a depth of 20 microns. The method offers surface alloying either by ion bombardment, or by depositing a film of the material facilitating formation of an amorphous layer. In the latter case, for example, on the basis of a copper foil an amorphous silicon film is deposited, which is then processed by a series of pulses.

This modification method, combined with further conditioning by low-current pulsed discharge can significantly increase dielectric strength of vacuum insulation. For example, pulse hold-off voltage doubles and even triples, and the prebreakdown currents are reduced by 2-3 orders of magnitude. Pulsed hold-off voltage of vacuum gaps with copper electrodes and with silicon coating achieves 1 MV/cm approximately at surface area of 10 $cm^2$. The proposed solution can be used to cope with practical problems related to the reliability of not only the high-voltage vacuum devices such as vacuum and gas-filled interrupters, electronic devices (modulator tubes, X-ray and neutron tubes and microwave devices), gas discharge tubes (thyratrons and spark gaps), but bigger objects utilizing insulators in a vacuum environment, including accelerators, nuclear reactors, equipment, space stations.

The invention claimed is:

1. A high-voltage electronic device comprising high-voltage electrodes, located in a dielectric envelope with an internal surface coated with a material, conductivity of which is greater than the conductivity of the envelope, characterized in that the areas subject to high field strength are coated with composite material, based on a polycrystalline material with a bulk conductivity of particles $10^{-9}$ to $10^{-13}$ $Ohm^{-1}$ $cm^{-1}$, each of which contains a surface nanolayer of bonding inorganic material; wherein the high-voltage electrodes have a modified surface, featuring ultra-fine-grained or amorphous structure with a depth up to 30 μm by means of treatment with a high-current pulsed electron or ion beam.

* * * * *